United States Patent
Fujidai et al.

(10) Patent No.: US 6,724,274 B2
(45) Date of Patent: Apr. 20, 2004

(54) FREQUENCY-SWITCHING OSCILLATOR AND ELECTRONIC DEVICE USING THE SAME

(75) Inventors: Masanori Fujidai, Shiga-ken (JP); Toshio Hata, Omihachiman (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 10/093,630

(22) Filed: Mar. 11, 2002

(65) Prior Publication Data

US 2002/0093390 A1 Jul. 18, 2002

Related U.S. Application Data

(62) Division of application No. 09/518,819, filed on Mar. 3, 2000, now Pat. No. 6,384,693.

(30) Foreign Application Priority Data

Oct. 29, 1999 (JP) .......................................... 11-308928

(51) Int. Cl.$^7$ ................................................. H03B 1/00
(52) U.S. Cl. ....................................................... 331/179
(58) Field of Search ............................. 331/179, 177 V, 331/177 R, 117 R (56) References Cited

U.S. PATENT DOCUMENTS

| | | | |
|---|---|---|---|
| 4,598,423 A | * | 7/1986 | Hettiger .................... 455/191.2 |
| 5,745,013 A | | 4/1998 | Hohmann |
| 5,821,820 A | | 10/1998 | Snider et al. |
| 6,008,702 A | | 12/1999 | Yamamoto |

FOREIGN PATENT DOCUMENTS

| | | |
|---|---|---|
| JP | 48-46251 | 10/1971 |
| JP | 59-2407 | 1/1984 |
| JP | 63-138805 | 6/1988 |
| JP | 5-191215 | 7/1993 |
| JP | 8-335828 | 12/1996 |
| JP | 09-307354 | 11/1997 |
| JP | 10-209752 | 8/1998 |
| JP | 10-270937 | 9/1998 |
| JP | 10-270937 | 10/1998 |
| JP | 11-186844 | 7/1999 |
| KR | 1019980137913 | 2/1998 |

* cited by examiner

*Primary Examiner*—Arnold Kinkead
(74) *Attorney, Agent, or Firm*—Burns, Doane, Swecker & Mathis, LLP (57) ABSTRACT

A frequency-switching oscillator which satisfies the conditions for oscillation, even when the switch width of the oscillation frequencies is great, without requiring a number of components to be increased. The impedance of a resonance system is set to satisfy the conditions for oscillation at two or more oscillation frequencies. A switching member is provided in the amplification system, and the oscillation frequencies are switched by changing the impedance of the amplification system. Since the resonance system does not require a switching member, loss is not caused by switching member in the resonance system, so the output level does not drop and the carrier-to-noise ratio does not deteriorate. Furthermore, without a switching member in the resonance system, the number of components can be reduced, making miniaturization and cost reduction possible.

12 Claims, 7 Drawing Sheets

FREQUENCY-SWITCHING OSCILLATOR AND ELECTRONIC DEVICE USING THE SAME

This application is a divisional of application Ser. No. 09/518,819 filed Mar. 3, 2000, now U.S. Pat. No. 6,384,693.

BACKGROUND OF THE INVENTION

1. Field of the Invention

The present invention relates to a frequency-switching oscillator and an electronic device using the same, and more particularly relates to a frequency-switching oscillator for switching oscillation frequencies by switching the feedback capacitance of a resonance system or an amplification system, and to an electronic device using the same.

2. Description of the Related Art

Generally, an oscillator has a resonance system and an amplification system, and the relationship between the resonance system and the amplification system must satisfy conditions for oscillation in order for the oscillator to oscillate. The conditions for oscillation are that the impedance of the amplification system has a negative resistance to compensate the impedance loss of the resonance system. In addition, the imaginary part of the impedance of the resonance system and the imaginary part of the impedance of the amplification system must have reverse signs, and the same absolute values. Further, in the Colpitts oscillator used in the following explanation, it is required for the impedance of the resonance system to be inductive to satisfy a condition of oscillation.

Figure 8:
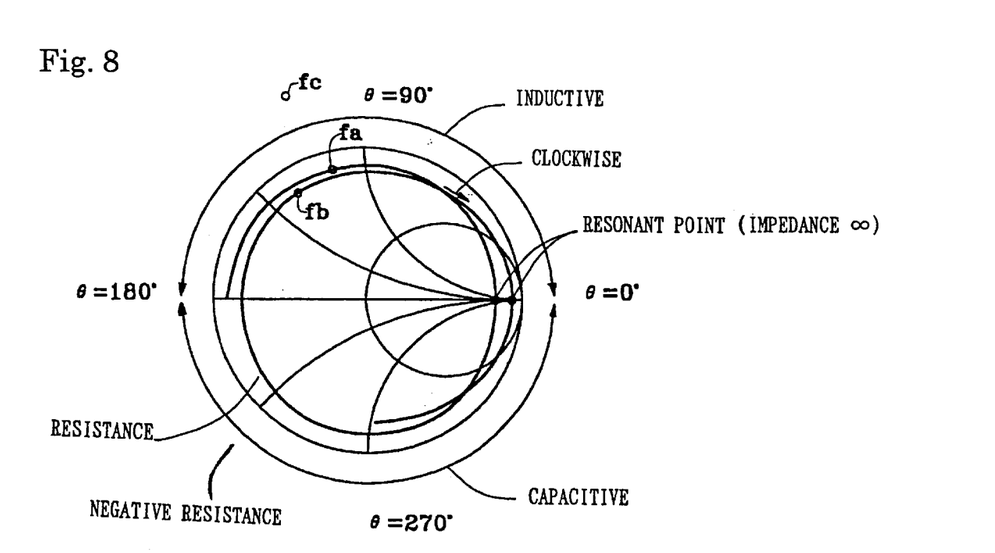
FIG. 8 is a Smith chart showing impedance in a resonance system and an amplification system of a frequency-switching oscillator.

FIG. 8 is a Smith chart showing frequency characteristics of the impedance of the resonance system and the amplification system. The top half portion of the circle shows that the impedance is inductive, and the bottom half portion of the circle shows that the impedance is capacitive. The inner portion of the circle shows that the impedance is a resistance, and the outer portion of the circle shows that the impedance is a negative resistance. Then, the point where the impedance on the right end of the circle is extremely high is called a resonance point. The phase q of the impedance is shown counterclockwise from the right end of the circle from 0 degrees to 360 degrees. In FIG. 8, the solid lines show the frequency characteristics of the impedance. The impedance at a higher frequency is shown as it moves clockwise from an impedance at a certain frequency on the solid line. For example, frequency fb is higher than frequency fa. Furthermore, the impedance at frequency fa and frequency fb is a resistance, and the impedance at frequency fc is a negative resistance. Moreover, the difference in phase of the impedance at frequency fa and at frequency fb is approximately 340 degrees. As an example of phase difference and a resonance point, in the Smith chart, the phase difference between an impedance at a given frequency on the solid line and an impedance at a frequency two cycles to the right from that impedance is 720 degrees, in which case the resonance point is passed twice.

A frequency-switching oscillator is an oscillator which outputs two or more oscillation frequency signals, and conditions for oscillation must be satisfied at each of the different oscillation frequencies. Conventional frequency-switching oscillators comprise a switch element as switching member in the resonance system, and output two or more oscillation frequencies, satisfying the conditions for oscillation at each of the different oscillation frequencies, by switching the state of the switch element.

Figure 9:
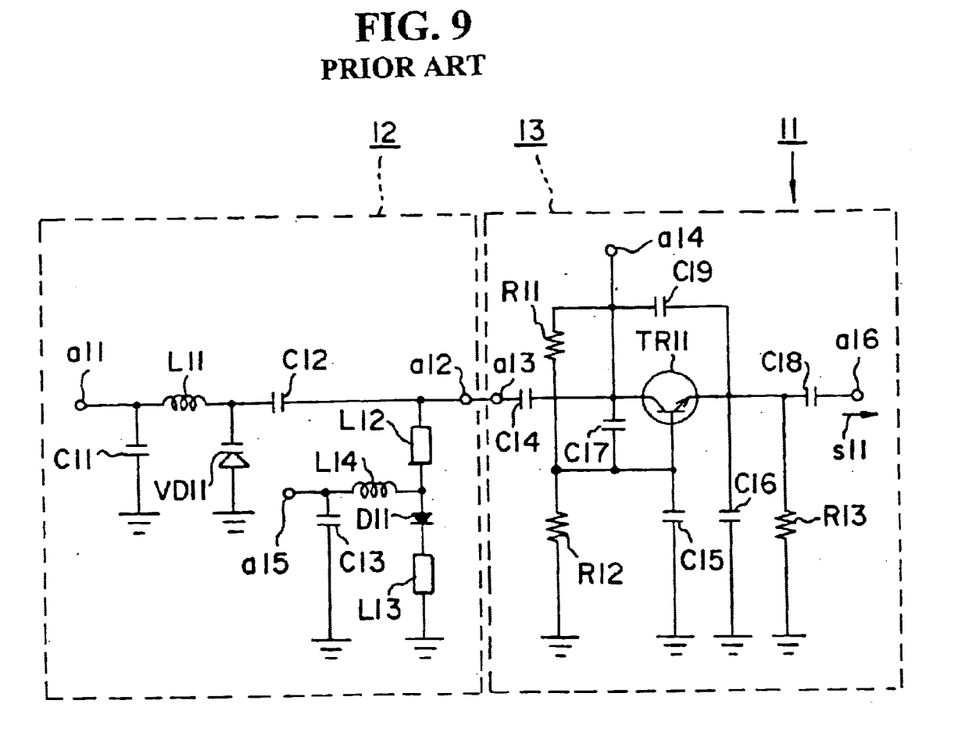
FIG. 9 is a circuit diagram showing a conventional frequency-switching oscillator.

FIG. 9 shows a conventional frequency-switching oscillator 11. The basic concept of the frequency-switching oscillator 11 shown in FIG. 9 is disclosed in Japanese Unexamined Patent Publication No. 9-307354.

In FIG. 9, the frequency-switching oscillator 11 is a Colpitts oscillator with oscillation frequencies f11 and f12, and is provided with a resonance system 12 and an amplification system 13 being connected.

Firstly, the resonance system 12 has a coil L12, a coil L13, a coil L14, a diode D11, a capacitor C13, and a switching voltage input terminal a15. These elements are important in determining the impedance of the resonance system. One end of the coil L12 is connected via a resonance output terminal a12 to the amplification system 13, and the other end is connected to the anode of the diode D11 and one end of the coil L14. The other end of the coil L14 is connected to the switching voltage input terminal a15, and is grounded via the capacitor C13. The cathode of the diode D11 is grounded via the coil L13.

Then, when a switching voltage is applied to the switching voltage input terminal a15, the diode D11 becomes conductive, thereby operating as a resonator which is termination-grounded by the coil L12 and the coil L13; when no switching voltage is applied, the diode D11 becomes nonconductive, thereby operating as a resonator which is termination-opened by the coil L12. Here, the coil L14 is a choke coil, and C13 is a ground capacitor.

The frequency-switching oscillator 11 is a voltage-controlled oscillator, having a coil L11, a capacitor C11, a capacitor C12, a variable-capacitance diode VD11, and a control voltage input terminal, which are all corresponding to the voltage-controlled portion. The capacitance value of the variable-capacitance diode VD11 is adjusted by a control voltage inputted from the control voltage input terminal via the coil L11 which is a choke coil. The variable-capacitance diode VD11 is connected via the capacitor C12 to one end of the coil L12.

The impedance of the resonance system 12 of such a frequency-switching oscillator 11 is the impedance seen from the resonance output terminal a12 of the resonance system 12 when the frequency-switching oscillator 11 is separated into the resonance system 12 and the amplification system 13.

Figure 10A:
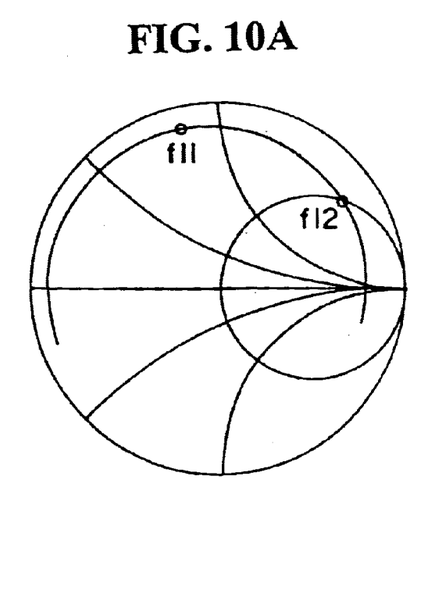
FIGS. 10A and 10B are Smith charts showing impedance of the amplification system of the frequency-switching oscillator of FIG. 9, FIG. 10A showing the impedance when the diode D1 is conductive, and FIG. 10B showing the impedance when the diode D11 is nonconductive.
Figure 10B:
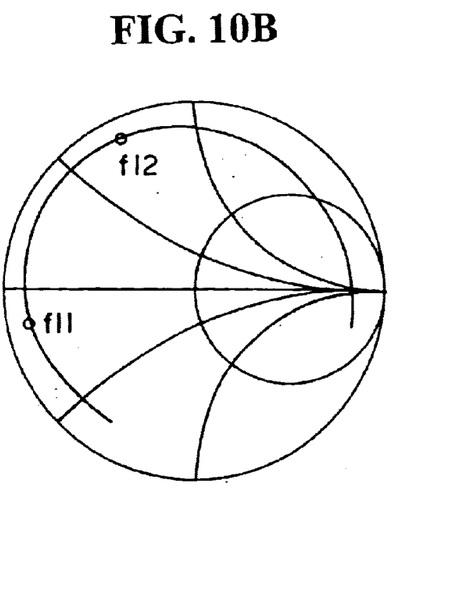

FIGS. 10A and 10B show frequency characteristics of the impedance of the resonance system 12 using a Smith chart. FIG. 10A shows the impedance when the diode D11 is conductive, and FIG. 10B shows the impedance when the diode D11 is nonconductive. Furthermore, the impedances at oscillation frequencies f11 and f12 are shown by reference numerals f11 and f12.

As shown in FIGS. 10A and 10B, when the diode D11 is conductive or nonconductive as a result of application of a switching voltage to the switching voltage input terminal a15, the impedance of the resonance system 12 greatly changes. FIG. 10A shows the case when a switching voltage is applied to the switching voltage input terminal a15, and the impedance of the resonance system 12 is inductive at f11 and f12. Then, FIG. 10B shows a case when no switching voltage is applied, whereby the impedance of the resonance system 12 is capacitive at f11, and inductive at f12.

Furthermore, in FIG. 9, in the amplification system 13, a transistor TR11 is an amplification element. The collector of the transistor TR11 is connected to a power supply input terminal a14, one end of a capacitor C19, and one end of a capacitor C17, and also is connected via a capacitor C14 to the resonance system 12. The base of the transistor TR11 is connected to the other end of the capacitor C17, and is grounded via the capacitor C15. In addition, a power supply voltage voltage-divided by a resistance R11 and a resistance R12 is input to the base of the transistor TR11. The emitter of transistor TR11 is connected to the other end of the capacitor C19, is grounded via a capacitor C16 and a resistance R13, and is connected via a capacitor C18 to an oscillation output terminal a16. Thus, the amplification system 13 has no switching member, and the frequency characteristics of the impedance of the amplification system 13 are not switched.

Figure 11:
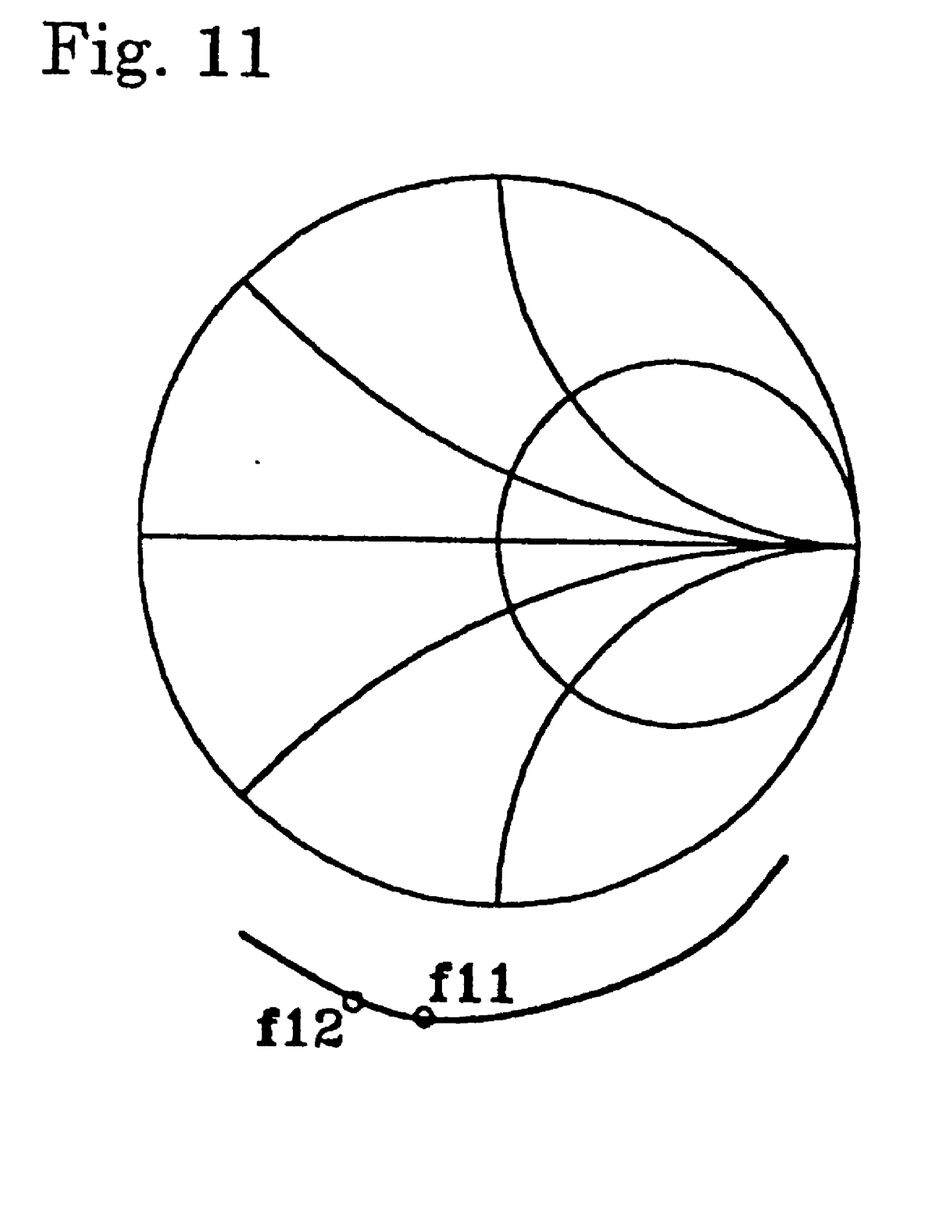
FIG. 11 is a Smith chart showing the impedance of an amplification system in the frequency-switching oscillator of FIG. 9.

The impedance of amplification system 13 is the impedance seen from the oscillation input terminal a13 when the frequency-switching oscillator 11 is separated into the resonance system 12 and the amplification system 13. FIG. 11 shows the impedance of the amplification system 13, and the impedance at the oscillation frequencies f11 and f12 is shown by reference numerals f11 and f12. In FIG. 11, the impedance of the amplification system 13 is a negative resistance at the oscillation frequencies f11 and f12.

Here, the following points can be understood from the impedances of the resonance system 12 and the amplification system 13. Firstly, at the oscillation frequencies f11 and f12 shown in FIG. 10A in the resonance system, the impedance is inductive, and satisfies the conditions for oscillation. Next, the impedances at the oscillation frequencies f11 and f12 of FIG. 11 satisfy the conditions for oscillation by having sufficient negative resistance to compensate the impedance at the oscillation frequencies f11 and f12 shown in FIG. 10A. The impedance at the oscillation frequency f11 of FIG. 11 in the amplification system has sufficient negative resistance to satisfy the conditions for oscillation. However, the impedance at the oscillation frequency f12 of FIG. 11 does not have sufficient negative resistance and therefore does not satisfy the conditions for oscillation. For this reason, when the diode D11 is conductive, i.e. the switch voltage is applied, the conditions for oscillation are only satisfied at the oscillation frequency f11.

The impedance at the oscillation frequency f11 shown in FIG. 10B is capacitive, and does not satisfy the conditions for oscillation. In contrast, the impedance at the oscillation frequency f12 is inductive and satisfies the oscillation conditions. Next, the impedance at the oscillation frequency f12 shown in FIG. 11 has sufficient negative resistance to supplement the impedance at the oscillation frequency f12 shown in FIG. 10B, and satisfies the conditions for oscillation. For this reason, when the diode D11 is nonconductive, the conditions for oscillation are only satisfied at the oscillation frequency f12.

Therefore, when a switching voltage is applied to the switching voltage input terminal a15, the oscillation signal s11 of the frequency-switching oscillator 11 is the oscillation frequency f11. When a switching voltage is not applied to the switching voltage input terminal a15, the oscillation signal s11 switches to the oscillation frequency f12.

According to the conventional frequency-switching oscillator 11, loss resulting from the internal resistance of the diode D11 increases the loss of the resonance system 12, and causes problems such as a drop in the output level, deterioration in the carrier to noise ratio, or the like.

Furthermore, according to the conventional frequency-switching oscillator 11, when it is desired to widen the switch width between the oscillation frequency f11 and the oscillation frequency f12, it can be designed to satisfy the conditions for oscillation by the switching member D11 provided in the resonance system 12. However, since the amplification system 13 does not include a switching member, the range of frequencies in which the impedance of the amplification system 13 has a sufficiently large negative resistance is narrow, making it impossible for the amplification system 13 to satisfy the conditions for oscillation. As a consequence, the conventional frequency-switching oscillator 11, in which the switching member D11 is provided in only the resonance system 12, has a disadvantage that it is difficult to set a large switch width between the oscillation frequencies f11 and f12. Particularly there has been a problem that it is very difficult to satisfy the conditions for oscillation when the frequency switch width has exceeded 500 MHz. When switching member is provided in the amplification system 13, in addition to the switching member D11 provided in the resonance system 12, it is possible to increase the switch width between the oscillation frequencies f11 and f12. However, in so doing, the number of components increases, miniaturization or cost reduction can not be achieved.

SUMMARY OF THE INVENTION

Accordingly, it is an object of the present invention to provide a frequency-switching oscillator in which the switching member does not cause loss in the resonance system, there is no drop in the output level, and no deterioration in the carrier to noise ratio.

Furthermore, it is an object of the present invention to provide a frequency-switching oscillator in which the switch width between oscillation frequencies can easily be increased without increasing the number of components, and which can be miniaturized and made inexpensive. In particular, it is an object of the present invention to provide a frequency-switching oscillator which can easily satisfy conditions for oscillation even when the frequency switch width has exceeded 500 MHz, or more.

In order to achieve the above mentioned objects, the frequency-switching oscillator of the present invention comprises a resonance system and an amplification system, for switching between two or more oscillation frequencies, the amplification system comprising a switching member. The switching member switches between two or more oscillation frequencies by switching the impedance of the amplification system so that the impedance of the amplification system satisfies conditions for oscillation at one of the oscillation frequencies, and does not satisfy the conditions for oscillation at other oscillation frequencies.

Preferably, the switching member changes the value of the feedback capacitance of the amplification system, and changes the frequency characteristics of the negative resistance of the impedance of the amplification system.

Preferably, the output of the frequency-switching oscillator is switched between two or more oscillation frequencies by switching only the impedance of the amplification system.

Preferably, the impedance of the resonance system satisfies the conditions for oscillation at two or more oscillation frequencies.

Preferably, the resonance system has a resonant point between the phase of the impedance of the resonance system at one of the oscillation frequencies, and the phase of the impedance of the resonance system at another of the oscillation frequencies.

Preferably, the resonance system has a phase shift circuit for determining the difference between the phase of the impedance of the resonance system at one of the oscillation frequencies, and the phase of the impedance of the resonance system at another of the oscillation frequencies.

Preferably, the resonance system has a resonance circuit, and the phase shift circuit has a coil and two capacitors. One end of the coil is connected to the resonance circuit, and is grounded via one of the capacitors. The other end of the coil is connected to the amplification system, and is grounded via the other capacitor.

Preferably, the resonance system has a resonance output terminal, and the amplification system has an oscillation input terminal, a switch voltage input terminal, and an oscillation output terminal. The oscillation input terminal is connected to the resonance output terminal, a switch voltage is input to the switch voltage input terminal, and an oscillating signal having two or more oscillation frequencies is output from the oscillation output terminal. The switching member is connected to the switch voltage input terminal, and switches the impedance of the amplification system by the switch voltage.

Preferably, the amplification system has an amplifier element and capacitance member, the amplifier element has a first terminal, a second terminal, and a third terminal. The first terminal is grounded in a high frequency band to be used, the second terminal is connected to the resonance system, and the capacitance member and the switching member are connected in series between the third terminal and the second terminal.

Preferably, the capacitance member is a capacitor, the switching member is a diode, one end of the capacitor is connected to the second terminal, the other end of the capacitor is connected to one end of the diode, the other end of the diode is connected to the third terminal, and the switch voltage input terminal is connected to one end of the diode.

Furthermore, an electronic device according to the present invention uses the frequency-switching oscillator described above.

According to the constitution described above, since the frequency-switching oscillator of the present invention comprises a switching member only in the amplification system, there is no loss caused by the switching member in the resonance system. Accordingly the output level does not decrease, and the carrier to noise ratio is good.

Furthermore, since there is a large phase difference between the impedances of the resonance system at each of the oscillation frequency, the carrier to noise ratio of the oscillation signal is good.

Furthermore, according to the frequency-switching oscillator of the present invention, there is a large phase difference between the impedances of the resonance system at each of the oscillation frequency. Consequently, the conditions for oscillation can easily be satisfied because the switching member is provided in the amplification system, even when the switch width between the oscillation frequencies is wide.

Furthermore, since no switching member is provided in the resonance system even when the switch width between the oscillation frequencies is wide, the number of components can be reduced, miniaturization and cost reduction can be achieved.

Furthermore, since the impedance of the resonance system satisfies the conditions for oscillation at two or more oscillation frequencies, there is no need to provide a switching member in the resonance system. As a consequence, the number of components can be reduced, miniaturization and cost reduction can be achieved.

Furthermore, the phase difference between the impedances of the resonance system can be greatly increased by providing a phase shift circuit in the resonance system. As a result, the conditions for oscillation can be easily satisfied, and the carrier to noise ratio can be improved.

Furthermore, since the electronic device of the present invention uses a frequency-switching oscillator in which the output level does not decrease, the carrier to noise ratio is good, and miniaturization and cost reduction are achieved, the electronic device consequently has similar advantages.

DESCRIPTION OF THE PREFERRED EMBODIMENTS

Figure 1:
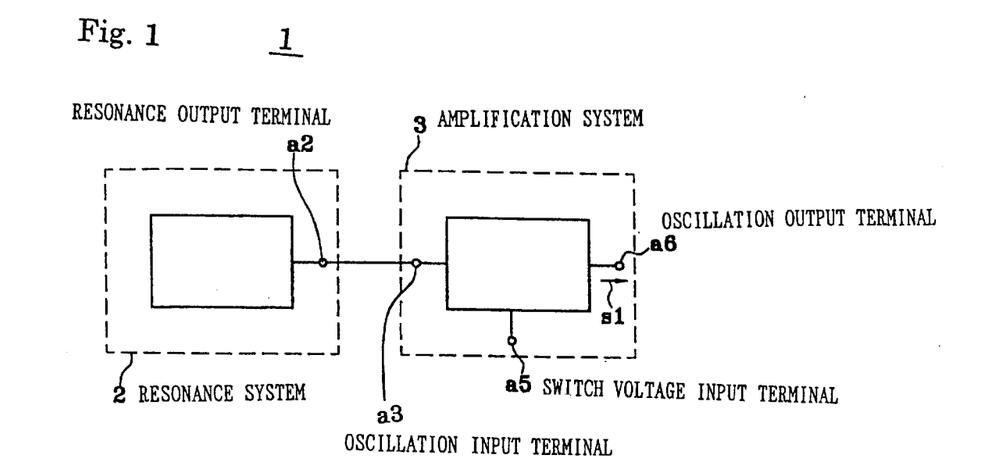
FIG. 1 is a block diagram showing a first embodiment of a frequency-switching oscillator of the present invention.

FIG. 1 shows a frequency-switching oscillator according to a first embodiment of the present invention. In FIG. 1, the frequency-switching oscillator 1 has a resonance system 2 and an amplification system 3. The resonance system 2 has a resonance output terminal a2, and the amplification system 3 has an oscillation input terminal a3, a switch voltage input terminal a5, and an oscillation output terminal a6. Furthermore, the resonance output terminal a2 and the oscillation input terminal a3 are connected.

In order to output the oscillation signal s1 at the oscillation frequency of f1 or f2 from the oscillation output terminal a6, the above frequency-switching oscillator 1 is required to have a constitution in which the resonance system 2 and the amplification system 3 satisfy conditions for oscillation at a plurality of frequencies.

Figure 2:
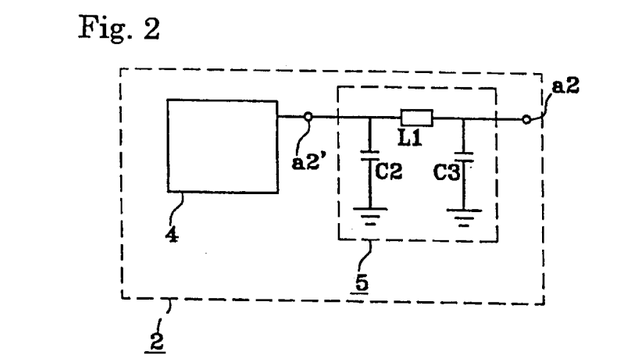
FIG. 2 is a diagram showing a detailed example of a resonance system of the frequency-switching oscillator of FIG. 1.
Figure 4A:
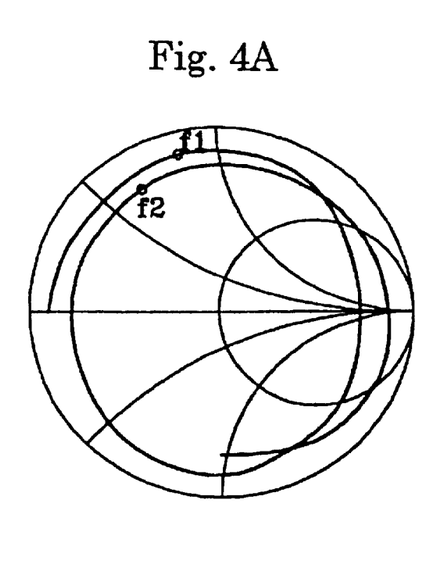
FIGS. 4A and 4B are Smith charts showing impedance of the resonance system of the frequency-switching oscillator of FIG. 1, FIG. 4A showing the impedance at a point a2, and FIG. 4B showing the impedance at a point a2
Figure 4B:
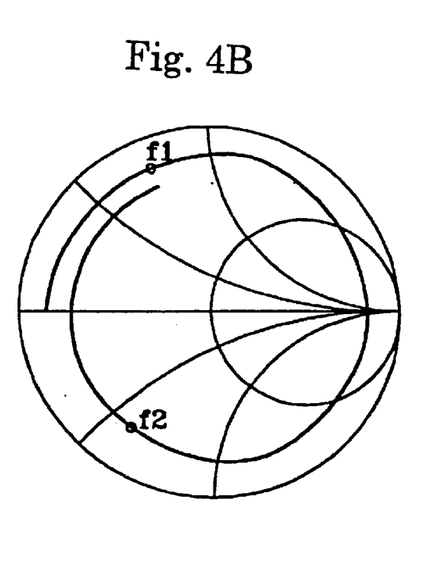

The internal configuration of the resonance system 2 of the frequency-switching oscillator 1 will be explained with reference to FIG. 2, and the impedance of the resonance system 2 viewed from the resonance output terminal a2 will be explained using FIGS. 4A and 4B. In FIG. 2, the same portions as or equivalent portions to those in FIG. 1 are given the same reference numerals, and explanation thereof is omitted. Furthermore, the reference numerals f1 and f2 shown in FIGS. 4A and 4B represent the impedances at the oscillation frequencies f1 and f2 respectively. Although the present invention is described herein in terms of oscillation at oscillation frequencies f1 and f2, it will be appreciated that the present invention may be configured to oscillate at more than two oscillation frequencies. That is, the present invention may oscillate at a plurality a plurality of oscillation frequencies.

In FIG. 2, the resonance system 2 has a resonance circuit 4 and a phase shift circuit 5, and the phase shift circuit 5 has a capacitor C2, a coil L1, and a capacitor C3. One end of the coil L1 is connected to the resonance circuit 4, and the other end is connected to the resonance output terminal a2. One end of each of the capacitors C2 and C3 is grounded. The other ends of capacitors C2 and C3 are connected to each respective end of the coil L1. Furthermore, the impedance of the resonance system 2 is shown in FIG. 4A. In FIG. 4A, the impedances at the oscillation frequencies f1 and f2 are inductive, and can for instance be used as an inductance element of a Colpitts oscillator. Moreover, there is a large phase difference between the impedances at the oscillation frequencies f1 and f2. Furthermore, there is a resonance point between each of the impedance.

Here, FIG. 4B shows the impedance viewed from the terminal a2 when the phase shift circuit 5 is removed from the resonance system 2. In FIG. 4B the impedance at the oscillation frequency f2 is a capacitive impedance, and does not satisfy the conditions for oscillation of a Colpitts oscillator. Thus, in FIG. 4A, by providing the phase shift circuit 5 in the resonance system 2, the difference in phase between the impedances is increased, as well as the conditions for oscillation are satisfied. If the impedance viewed from the terminal a2 when the phase shift circuit 5 is removed from the resonance system 2 in FIG. 4B satisfies the conditions for oscillation, the phase shift circuit 5 need not be provided.

Figure 3:
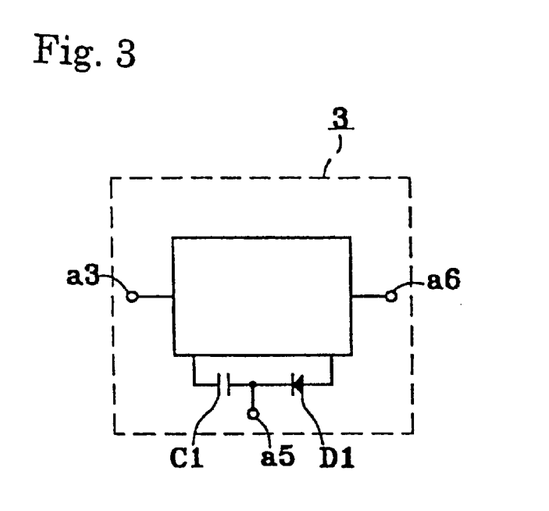
FIG. 3 is a diagram showing a detailed example of an amplification system of the frequency-switching oscillator of FIG. 1.

Next, the internal configuration of the amplification system 3 of the frequency-switching oscillator 1 will be explained in detail with reference to FIG. 3, and the impedance of the amplification system 3 viewed from the oscillation input terminal a3 will be explained using FIGS. 5A and 5B. In FIG. 3, the same portions as or equivalent portions to those in FIG. 1 are given the same reference numerals, and explanation thereof is omitted. Furthermore, reference numerals f1 and f2 shown in FIGS. 5A and 5B represent the impedance at the oscillation frequencies f1 and f2.

In FIG. 3, the amplification system 3 has a capacitance member comprising a capacitor C1, and a switching member comprising a diode D1. Then, the cathode of the diode D1, an end of the capacitor C1 and an end of the switch voltage input terminal a5 are connected, respectively. The diode D1 becomes conductive when a switch voltage is not applied to the switch voltage input terminal a5, and the diode D1 becomes nonconductive when a switch voltage is applied to the switch voltage input terminal as. Furthermore, FIGS. 5A and 5B show the impedance of the amplification system 3. FIG. 5A shows the impedance when a switch voltage is not applied to the switch voltage input terminal a5, i.e. diode D1 is conductive, and FIG. 5B shows the impedance when a switch voltage is applied to the switch voltage input terminal as, i.e. diode D1 is nonconductive.

Figure 5A:
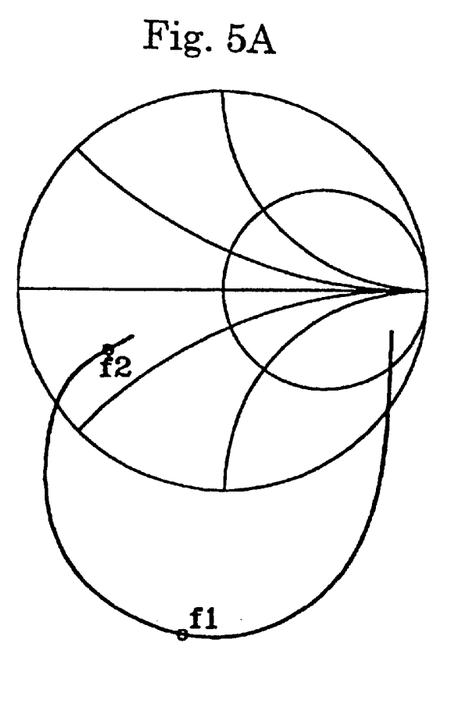
FIGS. 5A and 5B are Smith charts showing impedance of the amplification system of the frequency-switching oscillator of FIG. 1, FIG. 5A showing the impedance when the diode D1 is conductive, and FIG. 5B showing the impedance when the diode D11 is nonconductive.

When a switch voltage is not applied to the switch voltage input terminal a5, at the oscillation frequency f1 of FIG. 5A, the impedance has sufficient negative resistance to compensate the impedance of the resonance system 2 shown in FIG. 4A, and at the oscillation frequency f2 of FIG. 5A, the impedance does not have sufficient negative resistance to compensate the impedance of the resonance system 2 of FIG. 4A. Therefore, the frequency-switching oscillator 1 satisfies the conditions for oscillation at the oscillation frequency f1, but does not satisfy the conditions for oscillation at the oscillation frequency f2.

Figure 5B:
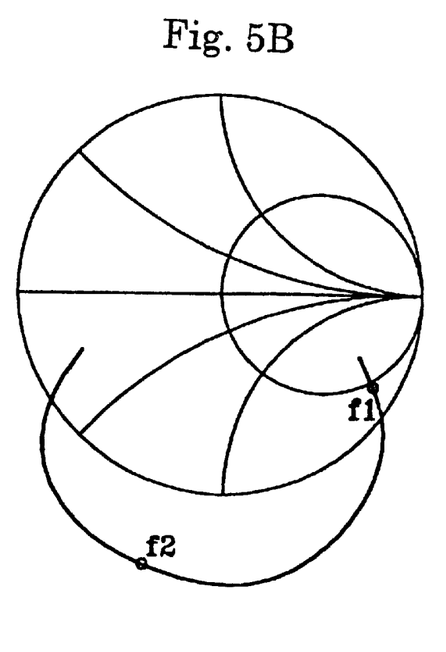

On the other hand, when a switch voltage is applied to the switch voltage input terminal a5, at the oscillation frequency f1 of FIG. 5B, the impedance does not have sufficient negative resistance to compensate the impedance of the resonance system 2 shown in FIG. 4A, but at the oscillation frequency f2 of FIG. 5B, the impedance does have sufficient negative resistance to compensate the impedance of the resonance system 2 of FIG. 4A. Therefore, the frequency-switching oscillator 1 does not satisfy the conditions for oscillation at the oscillation frequency f1, but satisfies the conditions for oscillation at the oscillation frequency f2.

Therefore, in the frequency-switching oscillator 1 of the above configuration in which the resonance system 2 and the amplification system 3 are connected, the oscillation signal s1 is outputted from the oscillation output terminal a6. The oscillation signal s1 has the oscillation frequency of f1 when the switch voltage is not applied to the switch voltage input terminal a5, i.e. the diode D1 is conductive, and has the oscillation frequency of f2 when the switch voltage is applied, i.e. the diode D1 is nonconductive.

Figure 6:
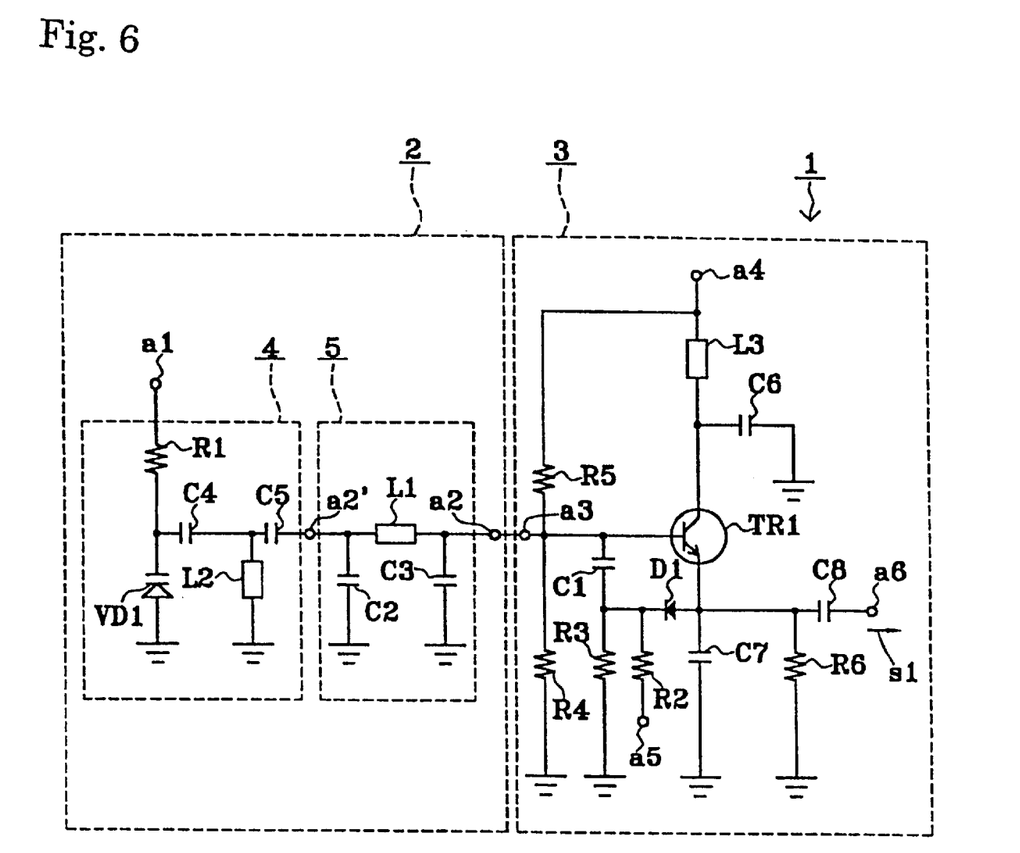
FIG. 6 is a circuit diagram showing a detailed example of the frequency-switching oscillator of FIG. 1.

FIG. 6 shows a detailed circuit diagram of the frequency-switching oscillator of the present invention shown in FIG. 1. In FIG. 6, the frequency-switching oscillator 1 has a resonance system 2 and a amplification system 3. The resonance system 2 has a resonance circuit 4 and a phase shift circuit 5. The frequency-switching oscillator 1 is a type of voltage-controlled oscillator, and consequently the resonance circuit 4 has a resistor R1, a variable-capacitance diode VD1, capacitors C4 and C5, and a coil L2. One end of the resistor R1 is connected to a control voltage input terminal a1, and the other end is connected to the cathode of the variable-capacitance diode VD1. The anode of the variable-capacitance diode VD1 is grounded. The cathode of the variable-capacitance diode VD1 is connected via the capacitor C4 to one end of the coil L2, and the other end of the coil L2 is grounded. Furthermore, one end of the coil L2 is connected via the capacitor C5 to the phase shift circuit 5. The phase shift circuit 5 has a coil L1, and capacitors C2 and C3. One end of the coil L1 is connected to the resonance circuit 4, and in addition, is grounded via the capacitor C2. The other end of the coil L1 is connected to the amplification system 3, and is grounded via the capacitor C3. As explained above, FIG. 4A shows the impedance of the resonance system 2, and FIG. 4B shows the impedance at point a2 when the phase shift circuit 5 is removed from the resonance system 2.

The amplification system 3 has an amplifier element comprising a transistor TR1, the switching member comprising a diode D1, the capacitance member comprising a capacitor C1, capacitors C6, C7, C8, a coil L1, and resistors R2, R3, R4, R5, and R6. The power supply voltage input terminal a4 is connected via the coil L3 to the collector of the transistor TR1, and is connected via the resistor R5 to the base of the transistor TRI. The collector of the transistor TR1 is grounded in a high frequency band to be used via the capacitor C6 for grounding. The base of the transistor TRI is connected via the oscillation input terminal a3 to the resonance system 2, and is grounded via the resistor R4. The emitter of the transistor TR1 is connected to the anode of the diode D1, grounded via the resistor R6 and the capacitor C7, and is connected to the oscillation output terminal a6 via the capacitor C8. The cathode of the diode D1 is connected via the capacitor C1 to the base of the transistor TR1, grounded via the resistor R3, and is connected to the switch voltage input terminal a5 via the resistor R2. In this way, in the specific circuit, when the switching member comprising the diode D1 is connected to the switch voltage input terminal a5, preferably the resistor R2 for protection should be provided therebetween. Then, the coil L3 is a choke coil, the capacitor C6 is a capacitor for grounding, the capacitor C7 is a capacitance between the emitter and the collector of the transistor TR1, and the resistors R3, R4, R5, and R6 are bias resistances. Then, the oscillation signal s1 is output from the oscillation output terminal a6 via the capacitor C8.

In the frequency-switching oscillator 1 having such a constitution, the synthetic capacitance is synthesized from the capacitor C1, which is the capacitance between the base and the emitter of the transistor TR1, and the diode D1. The synthetic capacitance greatly contributes to determining the frequency at which the impedance of the amplification system 3 has negative resistance. Then, when a switch voltage is applied to the switch voltage input terminal a5, the diode D1 becomes nonconductive, and the capacitance between the base and emitter of the transistor TR1 has a value obtained by connecting the capacitance of the capacitor C1 and the capacitance of the diode D1 in series. When no switch voltage is applied to the switch voltage input terminal a5, the diode D1 becomes conductive, and the capacitance between the base and emitter of the transistor TR1 has the value of the capacitance of the capacitor C1. As described above, the impedance of the amplification system 3 is shown in FIG. 5A when the diode D1 is conductive, and is shown in FIG. 5B when the diode D1 is nonconductive. Then, when the diode D1 is conductive, the impedance of the amplification system 3 has sufficient negative resistance at the oscillation frequency f1 to compensate the impedance of the resonance system 2, and is a resistance at the oscillation frequency f2. Furthermore, when the diode D1 is nonconductive, the impedance is a resistance at the oscillation frequency f1, and has sufficient negative resistance at the oscillation frequency f2 to compensate the impedance of the resonance system 2.

For example, when the frequency-switching oscillator 1 outputs oscillation frequencies f1=892.0 MHz and f2=1757.4 MHz, the output level at the frequency f1 is 3.04 dBm, and the carrier to noise ratio is −121 dBc/Hz. At the frequency f2, the output level is 4.3 dBm, and the carrier to noise ratio is −117 dBc/Hz.

Thus, according to the frequency-switching oscillator 1 described above, the resonance system 2 is not provided with the diode D1 as switching member, and the diode D1 is provided only in the amplification system 3. Then, by changing the state of the diode D1 in the amplification system 3 the frequency at which the impedance of the amplification system 3 have a negative resistance is altered, thereby enabling the oscillation frequency of the oscillation signal s1 to be switched between f1 and f2.

Furthermore, the frequency-switching oscillator of the present invention may, of course, be an oscillator other than a Colpitts. The output of the frequency-switching oscillator of the present invention may be switched between three or more oscillation frequencies. Furthermore, the resonance circuit 4 and the phase shift circuit 5 may be those shown in the embodiment described above, or they may have another constitution. In the preceding explanation, an NPN transistor was used as the amplification element, but it is acceptable to use a PNP transistor, an FET transistor, or the like. Furthermore, a mechanical switch and a capacitor connected in series or the like may be used as the switching member instead of the diode, the transistor, and the like. Switching member may also be provided in the resonance circuit 4.

Figure 7:
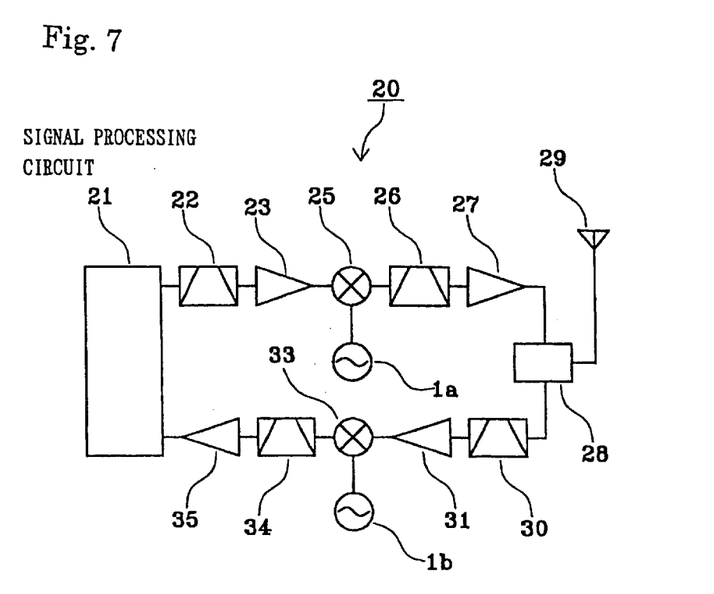
FIG. 7 is a block diagram showing an embodiment of an electronic device of the present invention.

FIG. 7 is a block diagram showing a communications device forming an embodiment of an electronic device according to the present invention. In FIG. 7, a communications device 20 comprises a signal processing circuit 21, bandpass filters 22, 26, 30, and 34, amplifiers 23, 27, 31, and 35, mixers 25 and 33, a duplexer 28, an antenna 29, and frequency-switching oscillators 1a and 1b of the present invention. Here, the output of the signal processing circuit 21 is connected in series via the bandpass filter 22 and the amplifier 23 to the mixer 25. Furthermore, the output of the frequency-switching oscillator 1a is connected to the mixer 25. Then, the output of the mixer 25 is connected in series via the bandpass filter 26 and the amplifier 27 to the duplexer 28. The duplexer 28 is connected to the antenna 29. Then, the duplexer 28 is connected in series via the bandpass filter 30 and the amplifier 31 to the mixer 33. The output of the frequency-switching oscillator 1b also is connected to the mixer 33. The output of the mixer 33 is connected in series via the bandpass filter 34 and the amplifier 35 to the signal processing circuit 21.

In the communications device 20 of such a configuration, firstly, during transmission, the signal processing circuit 21 creates an output signal, the bandpass filter 22 removes unwanted signals from this output signal, the amplifier 23 amplifies it, the mixer 25 mixes it with a signal from the frequency-switching oscillator 1a and a frequency conversion is performed through converting it to an RF signal, the bandpass filter 26 removes unwanted signals from the RF signal, the amplifier 23 amplifies it, and then the signal passes through the duplexer 28 and is radiated from the antenna 29. Furthermore, during reception, the RF signal received by the antenna 29 passes through the duplexer 28 and is input to the bandpass filter 30, which removes unwanted signals therefrom, the amplifier 31 amplifies it, the mixer 23 mixes it with a signal from the frequency-switching oscillator 1b and a frequency conversion is performed through converting it to an IF signal, the bandpass filter 34 removes unwanted signals from the IF signal, the amplifier 35 amplifies it, and then the signal is input to the signal processing circuit 21. Signals are received and transmitted in this way.

Thus, since the abovementioned communications device 20 uses frequency-switching oscillators 1a and 1b according to the present invention, in which switching member do not need to be provided in the resonance system, and consequently, the number of components can be reduced, miniaturization and cost reduction are achieved.

Furthermore, since the communications device 20 having the configuration described above uses the frequency-switching oscillators 1a and 1b of the present invention, the output level does not decrease and the carrier to noise ratio is excellent. Consequently a high-performance product can be provided.

An electronic device using the frequency-switching oscillator of the present invention was described above using the communications device 20, but the electronic device of the present invention is of course not limited to a communications device of this configuration.

Since the frequency-switching oscillator of the present invention is provided with the switching member in the amplification system, but not in the resonance system, there is no loss caused by switching member in the resonance system, no drop in the output level, and a good carrier to noise ratio.

Furthermore, in the frequency-switching oscillator of the present invention, since there is a large phase difference between the impedances at each oscillation frequency, the oscillation signal has a good carrier to noise ratio.

Furthermore, according to the frequency-switching oscillator of the present invention, since there is a large phase difference between the impedances at each oscillation frequency, and the switching member is provided in the amplification system, and therefore, the conditions for oscillation can easily be satisfied even when a switch width between the oscillation frequencies is wide.

Furthermore, in the frequency-switching oscillator of the present invention, since no switching member is provided in the resonance system when a switch width between the oscillation frequencies is wide, the number of components can be reduced, making miniaturization and cost reduction possible.

Furthermore, in the frequency-switching oscillator of the present invention, since the impedance of the resonance system satisfies the conditions for oscillation at two or more oscillation frequencies, there is no need to provide switching member in the resonance system. Consequently, the number of components can be reduced, making miniaturization and cost reduction possible.

Then, in the frequency-switching oscillator of the present invention, by providing a phase shift circuit in the resonance system, the phase difference between the impedances of the resonance system can be greatly increased, whereby the conditions for oscillation can be easily satisfied, and the carrier to noise ratio can be improved.

The electronic device using the frequency-switching oscillator of the present invention achieves similar effects to those described above.

What is claimed is:

1. A frequency-switching oscillator for switching between a plurality of oscillation frequencies, said frequency-switching oscillator comprising:

a resonance system;

an amplification system connected to said resonance system; and a switching member provided only within said amplification system, said switching member being controllable to set an impedance of said amplification system, wherein said frequency-switching oscillator oscillates at a first oscillation frequency among said plurality of oscillation frequencies when said amplification system is set to a first impedance, and said frequency-switching oscillator oscillates at a second oscillation frequency among said plurality of oscillation frequencies when said amplification system is set to a second impedance, wherein said switching member changes a value of feedback capacitance of said amplification system to alter frequency characteristics of a negative resistance of the impedance of said amplification system, and wherein said resonance system has a resonant point between a phase of the impedance of said resonance system at said first oscillation frequency and a phase of the impedance of said resonance system at said second oscillation frequency.

2. The frequency-switching oscillator according to claim 1, wherein said resonance system comprises a phase shift circuit determining a difference between a phase of an impedance of said resonance system at said first oscillation frequency, and a phase of an impedance of said resonance system at said second oscillation frequency.

3. The frequency-switching oscillator according to claim 2, wherein said phase shift circuit comprising:

a first capacitor;

a second capacitor; and a coil, wherein one end of said coil is connected to a resonance circuit and is grounded via said first capacitor, and another end of said coil is connected to said amplification system and is grounded via said second capacitor.

4. The frequency-switching oscillator according to claim 1, wherein:

said resonance system comprises a resonance output terminal;

said amplification system comprises an oscillation input terminal connected to said resonance output terminal, a switch voltage input terminal connected to said switching member, and an oscillation output terminal which outputs said plurality of oscillation frequencies;

wherein the impedance of said amplification system is switched by applying a switch voltage to said switch voltage input terminal.

5. The frequency-switching oscillator according to claim 1, wherein said amplification system comprises:

an amplifier element with a first terminal, a second terminal, and a third terminal, said first terminal is grounded in a high frequency band to be used, said second terminal being connected to said resonance system; and a capacitance member;

wherein said capacitance member and said switching member are connected in series between said third terminal and said second terminal.

6. The frequency-switching oscillator according to claim 5, wherein said capacitance member is a capacitor, a first end of said capacitor being connected to said second terminal; and wherein said switching member is a diode, a first end of said diode being connected to a second end of said capacitor, and a second end of said diode being connected to said third terminal; and said switch voltage input terminal being connected to said first end of said diode.

7. An electronic device comprising a frequency-switching oscillator, wherein the frequency-switching oscillator comprises:

a resonance system;

an amplification system in communication with said resonance system; and a switching member provided only within said amplification system, said switching member being controllable to set an impedance of said amplification system, wherein said frequency-switching oscillator oscillates at a first oscillation frequency among said plurality of oscillation frequencies when said amplification system is set to a first impedance, and said frequency-switching oscillator oscillates at a second oscillation frequency among said plurality of oscillation frequencies when said amplification system is set to a second impedance, wherein said switching member changes a value of feedback capacitance of said amplification system to alter frequency characteristics of a negative resistance of the impedance of said amplification system, and wherein said resonance system has a resonant point between a phase of the impedance of said resonance system at said first oscillation frequency and a phase of the impedance of said resonance system at said second oscillation frequency.

8. The electronic device comprising a frequency-switching oscillator according to claim 7, wherein said resonance system comprises a phase shift circuit determining a difference between a phase of an impedance of said resonance system at said first oscillation frequency, and a phase of an impedance of said resonance system at said second oscillation frequency.

9. The electronic device comprising a frequency-switching oscillator according to claim 8, wherein said phase shift circuit comprising:

a first capacitor;

a second capacitor; and a coil, wherein one end of said coil is connected to a resonance circuit and is grounded via said first capacitor, and another end of said coil is connected to said amplification system and is grounded via said second capacitor.

10. The electronic device comprising a frequency-switching oscillator according to claim 7, wherein said resonance system comprises a resonance output terminal;

said amplification system comprises an oscillation input terminal connected to said resonance output terminal, a switch voltage input terminal connected to said switching member, and an oscillation output terminal which outputs said plurality of oscillation frequencies;

wherein the impedance of said amplification system is switched by applying a switch voltage to said switch voltage input terminal.

11. The electronic device comprising a frequency-switching oscillator according to claim 7, wherein said amplification system comprises:

an amplifier element with a first terminal, a second terminal, and a third terminal, said first terminal is grounded in a high frequency band to be used, said second terminal being connected to said resonance system; and a capacitance member;

wherein said capacitance member and said switching member are connected in series between said third terminal and said second terminal.

12. The electronic device comprising a frequency-switching oscillator according to claim 11, wherein said capacitance member is a capacitor, a first end of said capacitor being connected to said second terminal; and wherein said switching member is a diode, a first end of said diode being connected to a second end of said capacitor, and a second end of said diode being connected to said third terminal; and said switch voltage input terminal being connected to said first end of said diode.

* * * * *